United States Patent [19]

Breese

[11] Patent Number: 4,806,064

[45] Date of Patent: Feb. 21, 1989

[54] COMPENSATING ROLL PIN FOR HEAT SINK MOUNTING

[75] Inventor: Leonard S. Breese, Carrollton, Tex.

[73] Assignee: Thermalloy Incorporated, Dallas, Tex.

[21] Appl. No.: 162,150

[22] Filed: Feb. 29, 1988

Related U.S. Application Data

[60] Continuation of Ser. No. 851,517, Apr. 14, 1986, abandoned, which is a division of Ser. No. 644,215, Aug. 24, 1984, Pat. No. 4,602,315.

[51] Int. Cl.[4] .............................................. H05U 7/20
[52] U.S. Cl. ................................ 411/479; 24/573; 411/509; 411/514; 411/516; 411/520; 174/16.4; 403/406.1
[58] Field of Search ................ 24/13, 48, 56, 150 R, 24/161; 411/477, 479, 500, 508, 509, 514, 516, 520, 521; 361/386, 388, 389, 400; 72/51, 52

[56] References Cited

U.S. PATENT DOCUMENTS 4,301,589 11/1981 Fredriksson ..................... 29/283

Primary Examiner—Timothy V. Eley
Attorney, Agent, or Firm—Kanz, Scherback & Timmons

[57] ABSTRACT

Disclosed is a compensating roll pin securing a heat sink to a circuit board. The roll pin comprises a deformable body of resilient material, such as annealed spring steel, formed into a generally cylindrical body having first and second end portions separated by a middle portion of enlarged external diameter and an axially extending gap in the surface of the body. A method of use is also disclosed wherein the first end portion of the roll pin is inserted into an aperture in a heat sink and the middle portion deformed within the aperture to form a tight fit between the pin and heat sink. A substantial part of the middle portion remains outside the aperture in the heat sink. The second end portion is inserted into a hole in a circuit board and forms an interference fit therewith. The middle portion forms a stop to prevent further insertion of the roll pin into the circuit board so that a gap of predetermined distance separates the heat sink and circuit board to enhance cooling.

9 Claims, 1 Drawing Sheet

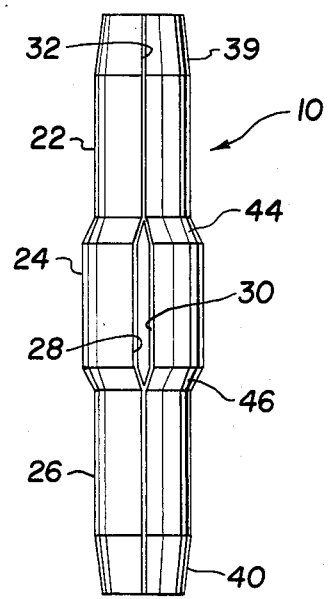
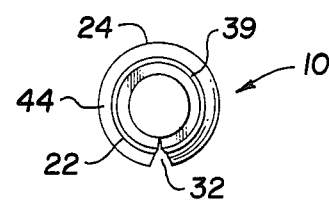
Fig. 2
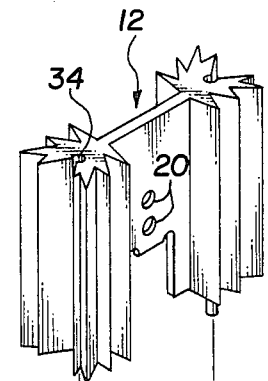
Fig. 1
Fig. 3
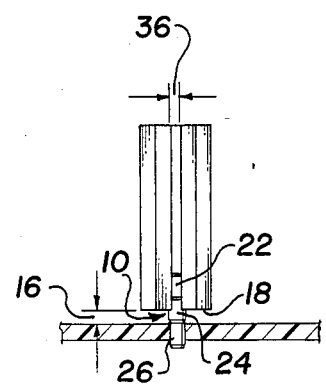
Fig. 4

COMPENSATING ROLL PIN FOR HEAT SINK MOUNTING

This application is a continuation of application Ser. No. 06/851,517 filed Apr. 14, 1986 (now abandoned) which was a division of application Ser. No. 644,215 filed Aug. 24, 1984 entitled Compensating Roll Pin for Heat Sink Mounting, now U.S. Pat. No. 4,602,315.

This invention relates to mounting of electrical components, particularly heat sinks, on a circuit board.

Modern electronic devices, such as transistors, often generate considerable heat. If provisions are not made to cool the device, the device can exceed its operating temperature and fail. In addition, adequate cooling of a device can lengthen its service life and increase reliability.

A common technique for cooling an electrical device is the use of a heat sink. The electronic device is mounted on the heat sink so that the heat generated in the device is readily transferred to the heat sink. The heat sink has a configuration, including cooling fins, which provides effective dissipation of heat from the heat sink to the atmosphere, either by natural convection or forced convection by use of a cooling fan.

Electronic devices are typically employed within a circuit laid out on a circuit board. If the electronic device is mounted on a heat sink, the heat sink will, in turn, be mounted to the circuit board with the necessary electrical connections being made between the device and the circuit board.

In the past, solid roll pins have been employed to mount a heat sink on a circuit board. The heat sink will be formed with an aperture of diameter equal to or slightly less than the diameter of the roll pin for an interference fit between the roll pin and the heat sink. A hole will be formed on the circuit board which also has a diameter equal to or less than the diameter of the roll pin so that the roll pin will also have an interference fit with the circuit board. Unfortunately, the use of such solid roll pins requires extremely fine tolerances in the heat sink and circuit board which are often difficult and expensive to achieve. Furthermore, if either the hole in the circuit board or aperture in the heat sink are enlarged through wear, the heat sink will no longer be securely mounted to the circuit board.

The CEM Company has introduced a roll pin marketed under the trademark SPIROL. This pin is formed by rolling a sheet of material into a tight helix, thereby resembling a cylinder. The helix can extend two complete revolutions about its center axis. While this is an improvement over conventional solid roll pins, the SPIROL roll pins will frequently be too large in diameter or too small in diameter which either makes it difficult to mount the heat sink on the circuit board or prevents the heat sink from being securely mounted thereon.

In addition to simply mounting the heat sink on a circuit board, it is often desirable to space the heat sink from the board to permit free air flow past the bottom of the heat sink. With the conventional roll pins noted above, it is very difficult to position the heat sink at a precise distance from the circuit board using the pins alone.

A need therefore exists for a roll pin having an enhanced ability to secure a heat sink to a circuit board with less emphasis on precise control of the diameter of the hole in the circuit board and the aperture in the heat sink. Furthermore, a need exists for a roll pin which permits precise positioning of the heat sink at a spaced distance from the circuit board.

In accordance with the present invention, a roll pin is provided for mounting a heat sink on a circuit board. The circuit board has at least one hole formed therein of first predetermined diameter. The heat sink has at least one aperture therein having a semicircular cross-section of a second predetermined diameter. The roll pin comprises a deformable material which is rolled into a generally cylindrical shape with a gap between the facing edges of the material. The pin has first and second end portions and a middle portion. The middle portion has a greater external diameter than the end portions. The gap between the facing edges in the middle portion is larger than the gap between the facing edges of the first and second end portions.

The first end is slidable into the aperture in the heat sink and the middle portion is deformed as it is urged into the aperture to provide a tight fit between the roll pin and heat sink. A substantial part of the middle portion remains external of the aperture. The second end portion is slidable into the hole in the circuit board for an interference fit therewith until the middle portion contacts the circuit board and spaces the heat sink a predetermined distance from the circuit board.

In accordance with another aspect of the present invention, a method is provided for mounting a heat sink on a circuit board. The method includes the step of sliding the first end of a roll pin into an aperture formed in the heat sink, the roll pin having first and second end portions and a middle portion, the middle portion having a greater external diameter than the end portions, the roll pin being formed by rolling a deformable material into a generally cylindrical shape with a gap between the facing edges of the material. The method further includes the step of urging the middle portion into the aperture to deform the middle portion and provide a tight fit between the roll pin and the heat sink with a substantial part of the middle portion external of the aperture. The method further includes the step of sliding the second end of the roll pin into a hole in the circuit board for an interference fit with the board until the middle portion contacts the circuit board to space the heat sink a predetermined distance from the circuit board.

For a more complete understanding of the invention and the advantages thereof, reference is now made to the following detailed description taken in connection with the accompanying drawings in which:

FIG. 1 is a side view of a roll pin forming a first embodiment of the invention;

FIG. 2 is an end view of the roll pin of FIG. 1;

FIG. 3 is an exploded perspective view of a heat sink and circuit board and the roll pins used to secure the heat sink to the circuit board; and FIG. 4 is a side view, in partial cross-section, of the heat sink mounted on the circuit board with the roll pin.

Referring simultaneously to FIGS. 1-4, a compensating roll pin 10 constructed in accordance with the present invention is illustrated. The roll pin 10 is employed to secure a heat sink 12 to a circuit board 14 as seen in FIGS. 3 and 4. Furthermore, the roll pin 10 serves as a spacer to space the heat sink 12 a predetermined distance 16 above the surface of the circuit board 14 to permit air to flow along the bottom 18 of the heat sink 12.

The heat sink 12 has a number of holes 20 formed therein. Holes 20 are adapted to receive some type of electrical component, such as a transistor, for mounting on the heat sink. The heat generated by the electrical component will be conducted into the heat sink 12 and dissipated to the surrounding atmosphere. While the main structural support for the electronic device will be the heat sink, various leads from the electronic device will be directly connected to the circuit board 14.

As can best be seen in FIGS. 1 and 2, the roll pin 10 is formed by rolling a deformable material into a generally cylindrical shape. The roll pin 10 includes a first end portion 22, a middle portion 24 and a second end portion 26. As the material is rolled, the facing edges 20 and 30 will be separated by a gap 32 which will permit the pin to deform slightly inwardly to decrease its external diameter as will be discussed in greater detail hereinafter.

As can best be seen in FIG. 3, the heat sink 12 includes apertures 34 which form an integral part of the cooling fin structure at each end of the heat sink. The apertures 34 have a generally semicylindrical cross-section and a first predetermined diameter 36. The semicircular cross-section of aperture 34 extends about an arc of over 180° but can be less than 360°.

The circuit board 14 has a pair of holes 38 formed through the board for receiving pins 10 secured to the heat sink 12.

When the heat sink 12 is to be mounted on the circuit board, the roll pins 10 are preferably first mounted in the heat sink 12. For each pin 10, the first end portion 22 is slid into an aperture 34 of heat sink 12 at the bottom 18 until the middle portion 24 contacts the opening in the aperture 34. The outer diameter of the first end portion 22 can be designed to either provide some interference fit between the first end portion and the aperture 34 or to permit the first end portion 22 to slide without interference into the aperture 34. A conical guide surface 39 is provided on the first end portion 22 to assist in inserting it within the aperture 34.

When the middle portion 24 is moved into contact with the opening of aperture 34, the pin 10 can be forced into the aperture 34. This will deform a part of the middle portion 24 to provide a tight fit between the pin 10 and the heat sink 12 as seen in FIG. 4. As can best be seen in FIG. 1, the gap 32 in the middle portion 24 is significantly larger than the gap in the end portions 22 and 26. This permits the middle portion 24 to be deformed radially inwardly, reducing the gap 32, as the middle portion is inserted within the aperture 34. As will be observed in FIG. 4, only part of the middle portion 24 will need to be inserted in the aperture to provide a tight fit in the heat sink 12 so that a significant part of the portion 24 remains outside the aperture 34.

When the roll pins 10 have been properly mounted in the heat sink 12, the second end portion 26 of the roll pins 10 can be inserted within the holes 38 in the circuit board. The second end portion also has a conical guide 40 to assist the entry of the portion 26 within the hole 20. The external diameter of the second end portion 26 is preferably sized so that an interference fit is created between a portion 26 and hole 38 to secure the roll pins 10 and heat sink 12 on the circuit board 14. The gap 32 in second end portion 26 will permit the diameter of hole 38 to be less precisely formed. The external diameter of the end portion 26 can decrease to compensate for the size of hole 38 as the pin 10 is inserted in hole 38 through deformation of end portion 26 permitted by gap 32 while still providing a tight interference fit. This feature also will permit the heat sink 12 to be securely mounted to board 14 even if the diameters of holes 38 are increased by wear cause by removal and remounting of the heat sink 12. The pin 10 can be constructed of material of sufficient resiliency so that the end portion 26 will expand to near its original undeformed external diameter. Thus, if holes 38 do not wear to a diameter greater than that of the non-compressed end portion 26, the pins 10 will provide repeated secure mounting for heat sink 12.

In the preferred embodiment the second end portion 26 is urged into a hole 38 so that the middle portion 24 comes into contact with the upper surface 42 of the circuit board. Because a finite length of the middle portion 24 is outside the aperture 34, the heat sink 12 will be spaced the predetermined distance 16 off the upper surface 42 of the circuit board to permit cooling air to flow to all sides of the heat sink.

The conical transition surface 44 between the first end portion 22 and middle portion 24 acts as a wedge to begin the deformation of the middle portion 24 as it is forced into the aperture 34. The conical transition surface 46 between the second end portion 26 and middle portion 24 acts as a stop to limit the extent to which pin 10 can be inserted into a hole 38 in the circuit board 14.

The heat sink will often need to be electrically connected to the circuit board 14. Commonly, the heat sink will be grounded to the circuit board ground. Preferably, the roll pins 10 which mount the heat sink 12 on the circuit board 14 will also be used as the electrical connection between these two members. For this reason, the roll pin 10 should readily accept a solder bond. The roll pin 10 can be clad with a solderable coating material which promotes the formation of solder bonds such as tin or tin-lead alloys. The pre-clad material may be applied by conventional pre-tinning or by plating or the like. Such pre-clad is conventionally referred to as "pre-tin" regardless of the composition of the material or the process by which it is applied, and the terms "pre-tinned", "pre-tin", "tin-plated" and "tin-coated" are interchangeably used to refer to solderable or solder promoting coatings regardless of the actual composition of the coating or the manner by which the coating is applied.

While any suitable material can be used to form a roll pin 10, roll pins 10 constructed from annealed spring steel having a thickness of 0.015 in. (0.38 millimeters) have proven satisfactory. The external diameters of the first and second end portions were identical at 0.085 in. (2.16 millimeters) and the difference in diameter between the middle portion and the end portions was about 0.020 in. (0.51 millimeters).

As can be seen, the roll pin 10 has several advantages over the prior art. Initially, since the middle portion 24 will be deformed to enter the aperture 34, the permitted variance in the nominal diameter of the pin will be greater than if a solid roll pin is used for an interference fit with the aperture. In addition, provision of the gap 32 in the second end portion 26 permits the dimensional tolerances in holes 38 in the circuit board 14 to be greater as the diameter of the second end portion can be varied to fit the holes 38 by deforming the end portion 26 and reducing the size of the gap 32. Furthermore, middle portion 24 provides a simple and accurate means for spacing the heat sink a desired distance 16 from the circuit board 14 without the use of additional spacing members which increase the cost and complexity of the heat sink. In the preferred embodiment, the roll pin 10 will by symmetrical about the middle portion 24 which permits each end portion of the pin to be inserted in either the heat sink or the circuit board.

While the invention has been described herein with respect to a specific embodiment thereof, it will be understood that various changes and modifications will be suggested to one skilled in the art and it is intended that such changes and modifications fall within the scope of the appended claims.

What is claimed:

1. A pin for mounting a heat sink on a circuit board comprising a hollow cylindrical body forming an elongated tube with an axially extending gap in the wall of said tube extending substantially the full axial length thereof, said cylindrical body having first and second end portions and a middle portion intermediate said end portions and having an external diameter reducing taper adjacent the terminal ends of said end portions, the external diameter of said middle portion being greater than the external diameters of said first and second end portions.

2. A pin as defined in claim 1 wherein said axially extending gap is wider in said middle portion than in said first and second end portions.

3. A pin as defined in claim 1 including conical transitional surfaces between said end portions and said middle portion.

4. A roll pin for mounting a heat sink having at least one aperture therein on a circuit board having at least one hole therein, said roll pin comprising:

(a) a deformable sheet material formed into a generally elongated hollow cylindrical shape with a gap extending axially between the facing longitudinally extended edges of the material along substantially the full length thereof, the cylindrical shape having first and second end portions and a middle portion, the middle portion having a greater external diameter than the end portions;

(b) the first end portion adapted for insertion into the aperture in the heat sink, the middle portion adapted to be deformed as it is urged into the aperture to provide a tight fit between the roll pin and the heat sink and to permit a substantial part of the middle portion of the roll pin to remain external of the aperture; and (c) the second end portion of the roll pin adapted for insertion into the hole in the circuit board to form an interference fit with the board when the middle portion of the roll pin contacts the circuit board, thereby to space the heat sink a predetermined distance from the circuit board..

5. A roll pin as defined in claim 4 wherein said deformable material is annealed spring steel.

6. A roll pin as defined in claim 4 wherein each of said end portions has a conical guide surface for guiding the roll pin into the aperture in the heat sink and hole in the circuit board, respectively.

7. A roll pin as defined in claim 4 wherein the roll pin has conical transition surfaces between the end portions and the middle portion, the conical transition surface between the first end portion and the middle portion adapted to assist in deformation of the middle portion as the pin is urged into the aperture in the heat sink, the conical transition surface between the second end portion and the middle portion adapted to act as a stop and prevent further insertion of the pin into the hole.

8. A roll pin as defined in claim 4 wherein at least the outer surface of the roll pin is electrically conductive to provide electrical communication between the heat sink and the circuit board.

9. A roll pin as defined in claim 4 wherein the gap between the facing edges in the middle portion is larger than the gap between the facing edges in the end portions.

* * * * *

UNITED STATES PATENT AND TRADEMARK OFFICE
CERTIFICATE OF CORRECTION

PATENT NO. : 4,806,064

DATED : February 21, 1989

INVENTOR(S) : Leonard S. Breese

It is certified that error appears in the above-identified patent and that said Letters Patent is hereby corrected as shown below:

Column 3, line 12, "edges 20" should read---edges 28---

Signed and Sealed this

Eighth Day of August, 1989

Attest:

DONALD J. QUIGG

Attesting Officer

Commissioner of Patents and Trademarks